United States Patent
Egashira (10) Patent No.: US 7,764,357 B2
(45) Date of Patent: Jul. 27, 2010

(54) EXPOSURE APPARATUS AND DEVICE MANUFACTURING METHOD

(75) Inventor: Shinichi Egashira, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 40 days.

(21) Appl. No.: 12/237,960

(22) Filed: Sep. 25, 2008

(65) Prior Publication Data

US 2009/0091722 A1    Apr. 9, 2009

(30) Foreign Application Priority Data

Oct. 9, 2007    (JP) .............................. 2007-262947

(51) Int. Cl.
*G03B 27/42* (2006.01)
*G03B 27/52* (2006.01)
(52) U.S. Cl. .......................................... 355/53; 355/55
(58) Field of Classification Search .................. 355/52, 355/53, 55, 67; 250/548; 356/399–401
See application file for complete search history.

(56) References Cited

U.S. PATENT DOCUMENTS 5,674,651 A * 10/1997 Nishi ........................... 430/22
5,808,910 A * 9/1998 Irie et al. ..................... 700/279
6,509,956 B2 * 1/2003 Kobayashi ..................... 355/55
7,160,655 B2 * 1/2007 Noudo et al. ................... 430/22
2006/0040191 A1 * 2/2006 Okita ............................ 430/22

FOREIGN PATENT DOCUMENTS

EP           1326141 A2    9/2003
JP        2003-203846 A    7/2003

* cited by examiner

*Primary Examiner*—Hung Henry Nguyen
(74) *Attorney, Agent, or Firm*—Canon U.S.A., Inc. I.P. Division (57) ABSTRACT

An exposure apparatus, that exposes each shot according to shot arrangement on a substrate, includes a detector configured to detect a mark; and a processor configured to determine a coefficient of an expression that represents the shot arrangement by coordinate transformation of reference shot arrangement based on the positions of marks of a plurality of shots on the substrate detected by the detector, the processor being configured to calculate, from a relationship between a feature value of a signal of a mark detected by the detector and an offset value for the coefficient, and a feature value of a signal of a mark detected by the detector, an offset value for the coefficient, and to offset the coefficient with the calculated offset value, wherein the processor is further configured to learn the relationship based on a coefficient that represents an error of the offset coefficient obtained through an overlay inspection apparatus, the offset value, and the feature value.

9 Claims, 10 Drawing Sheets

EXPOSURE APPARATUS AND DEVICE MANUFACTURING METHOD

BACKGROUND OF THE INVENTION

1. Field of the Invention

The present invention relates to an exposure apparatus that exposes each shot according to a shot arrangement on a substrate, and a device manufacturing method using the exposure apparatus.

2. Description of the Related Art

Projection exposure apparatuses used for manufacturing semiconductor devices have been required to project a circuit pattern on a reticle onto a wafer with higher resolving power along with increased fineness and density of circuits. Since the projection resolving power of a circuit pattern depends on the numerical aperture (NA) of a projection optical system and the wavelength of exposure light, high resolution can be achieved by increasing the NA of a projection optical system and using exposure light having a shorter wavelength. Regarding the latter, exposure light sources have shifted from g-line to i-line and from i-line to excimer laser. Exposure apparatuses that use excimer lasers having oscillation wavelengths of 248 nm and 193 nm have already been put to practical use. Currently, an EUV exposure technique that uses exposure light having a wavelength of 13 nm is being studied as a candidate for next-generation exposure technique.

The process for manufacturing semiconductor devices have become diversified, and techniques such as CMP (Chemical Mechanical Polishing) process have attracted attention as planarization techniques for solving the problem of insufficient focal depth in exposure apparatuses. There are great variety of structures and materials of semiconductor devices. For example, a P-HEMT (Pseudomorphic High Electron Mobility Transistor) and an M-HEMT (Metamorphe-HEMT) that are made by combining compounds such as GaAs and InP, and an HBT (Heterojunction Bipolar Transistor) that uses SiGe, SiGeC, or the like, have been proposed.

Meanwhile, increased fineness of circuit patterns has required highly precise alignment between a reticle on which a circuit pattern is formed and a wafer onto which the circuit pattern is projected. The required precision is 1/3 of the circuit line width. For example, the required precision in the current 90 nm design is 30 nm.

However, when wafer alignment is performed, a WIS (wafer induced shift) caused by the manufacturing process can occur. This WIS reduces the performance of semiconductor devices and the yield of manufacturing of semiconductor devices. The WIS is an error in the measurement of alignment marks on a wafer, caused by the device manufacturing process. The WIS is caused, for example, by the asymmetry in the structure of alignment marks or the asymmetry in the shape of photoresist applied to a wafer due to a planarization process such as a CMP process. In addition, since semiconductor devices are made through a plurality of processes, optical conditions of alignment marks differ from process to process, and variation in WIS becomes a problem.

To cope with this, in a hitherto known wafer alignment technique, the most suitable alignment parameter is selected from a plurality of alignment parameters for each process. However, to determine the most suitable alignment parameter, it is necessary to actually expose a wafer and perform overlay inspection using some parameters. This takes a lot of time. In view of such a problem, Japanese Patent Laid-Open No. 2003-203846 proposes a method for performing high precision alignment from which a WIS is removed, without optimizing the alignment parameter. In this method, a WIS is removed from the alignment result using "a quantified value of the asymmetry or the contrast of an alignment mark signal (hereinafter referred to as feature value).

In the method of Japanese Patent Laid-Open No. 2003-203846, a plurality of feature values are separately used as correction values. However, since the WIS in question on the device manufacturing scene complexly changes due to an interaction between feature values, the technique in which feature values are separately used as correction values cannot highly precisely correct the WIS. In addition, a coefficient for transforming a feature value into a correction value changes in a new device manufacturing process or when conditions of a device manufacturing process are significantly changed.

SUMMARY OF THE INVENTION

In view of the above-described background art, the present invention reduces alignment error.

In an aspect of the present invention, an exposure apparatus, that exposes each shot according to shot arrangement on a substrate, includes a detector configured to detect a mark, and a processor configured to determine a coefficient of an expression that represents the shot arrangement by coordinate transformation of reference shot arrangement on the basis of the positions of marks of a plurality of shots on the substrate detected by the detector. The processor calculates, from a relationship between a feature value of a signal of a mark detected by the detector and an offset value with respect to the coefficient, and from the feature value, the offset value, and offsets the coefficient with the calculated offset value. The processor is further configured to learn the relationship on the basis of a coefficient that represents an error of the offset coefficient obtained through an overlay inspection apparatus, the offset value, and the feature value.

In another aspect of the present invention, a method is applied to a detector that detects a mark, and an exposure apparatus that calculates shot arrangement on a substrate on the basis of the positions of marks of a plurality of shots on the substrate detected by the detector and that exposes each shot according to the calculated shot arrangement. The method includes calculating a coefficient of an expression that represents the shot arrangement by coordinate transformation of reference shot arrangement on the basis of the positions of the marks of the plurality of shots; calculating, from a relationship between a feature value of a signal of a mark detected by the detector and an offset value with respect to the coefficient, and from the feature value, the offset value; offsetting the coefficient with the calculated offset value to calculate the shot arrangement on the substrate; and learning the relationship on the basis of a coefficient that represents an error of the offset coefficient obtained through an overlay inspection apparatus, the offset value, and the feature value.

In another aspect of the present invention, a method of manufacturing a device includes exposing a substrate to radiant energy using the above-described exposure apparatus, developing the exposed substrate, and processing the developed substrate to manufacture the device.

According to the present invention, for example, the alignment error can be reduced.

Further features of the present invention will become apparent from the following description of exemplary embodiments with reference to the attached drawings.

DESCRIPTION OF THE EMBODIMENTS

In the embodiments of the present invention, the present invention is applied to an exposure apparatus that projects a pattern image of a reticle or a mask onto a semiconductor wafer. An alignment method according to the embodiments includes calculating a plurality of mark feature values that quantitatively represent the feature of a mark signal, calculating a WIS predicted quantity from each mark feature value, and correcting the alignment result using the calculated WIS predicted quantity. The transform coefficient for calculating a WIS predicted quantity from each mark feature value is updated by inputting the result of the overlay inspection performed on the device manufacturing scene into the exposure apparatus.

In this way, WIS-removed high precision alignment can be performed without optimizing the alignment parameters in a situation where the device manufacturing process changes.

Statistical operations are performed on the mark feature value of each shot to calculate "shot arrangement components of the mark feature value." Using "the transform coefficient of each shot arrangement component" updated on the basis of the result of the overlay inspection, "the WIS predicted quantity of the shot arrangement correction value" is calculated. Correcting the shot arrangement correction value at the time of alignment makes it possible to highly precisely correct only the WIS of the shot arrangement component in question on the device manufacturing scene. In addition, when each shot arrangement component has a different transform coefficient, the WIS can be corrected with a high degree of precision. The term "shot arrangement component(s)" means one or more of, for example, a shift component, a magnification component, and a rotation component of the shot arrangement in a wafer.

The above feature value of a mark signal is calculated using one or more of, for example, a quantity that represents the asymmetry of a mark signal, the contrast of a mark signal, a quantity that represents the S/N of a mark signal, and a quantity that represents the shape of a mark signal. The above transform coefficient is calculated, for example, from the result of an inspection of the misalignment quantity and the predicted quantity of misalignment. Alternatively, the above transform coefficient is calculated from a fixed correction quantity for correcting the mark position detecting position and the predicted quantity of misalignment. Alternatively, the above transform coefficient can be the transform coefficient of one of the shift component, magnification component, and rotation component of the shot arrangement, or the mean of the transform coefficients of two or more of them.

The various embodiments of the present invention will now be described with reference to the drawings. In the following embodiments, the present invention is applied to an exposure apparatus.

First Exemplary Embodiment

Figure 1:
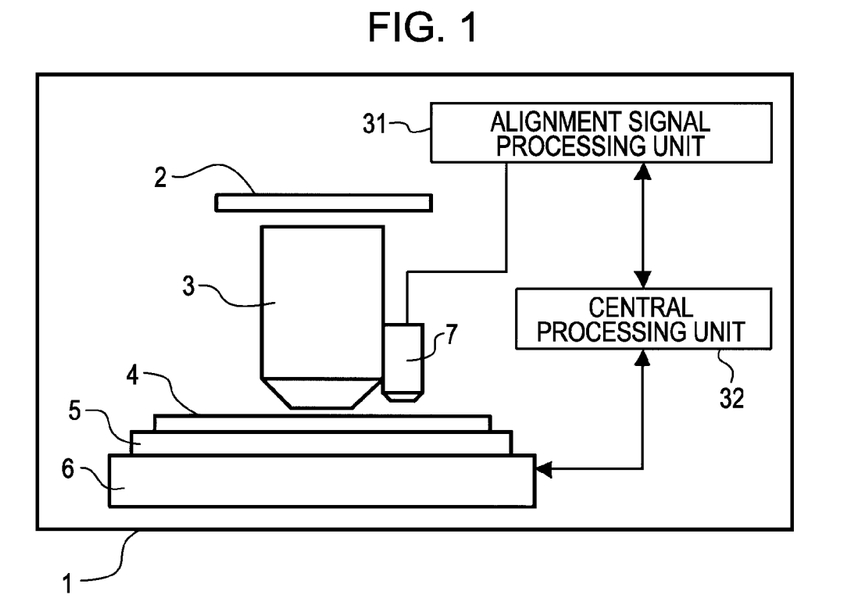
FIG. 1 is a schematic view of an example semiconductor exposure apparatus according to an embodiment of the present invention.

FIG. 1 is a schematic view of a semiconductor exposure apparatus according to an embodiment of the present invention. As shown in FIG. 1, an exposure apparatus 1 has a reduction projection optical system 3 that reduces and projects a reticle 2 on which a circuit pattern is formed, and a wafer chuck 5 that holds a wafer 4 on which a base pattern and alignment marks have been formed in a preceding process. In addition, the exposure apparatus 1 has a wafer stage 6 that positions the wafer 4 at a predetermined position, and an alignment detecting optical system 7 that detects the position of an alignment mark 11 (FIG. 2) on the wafer 4. Moreover, the exposure apparatus 1 has an alignment signal processing unit 31 that processes a signal from the alignment detecting optical system 7, and a central processing unit 32 that controls the operation of the whole exposure apparatus 1. For example, the central processing unit 32 drives the wafer stage 6 on the basis of a signal from the alignment signal processing unit 31.

Figure 2:
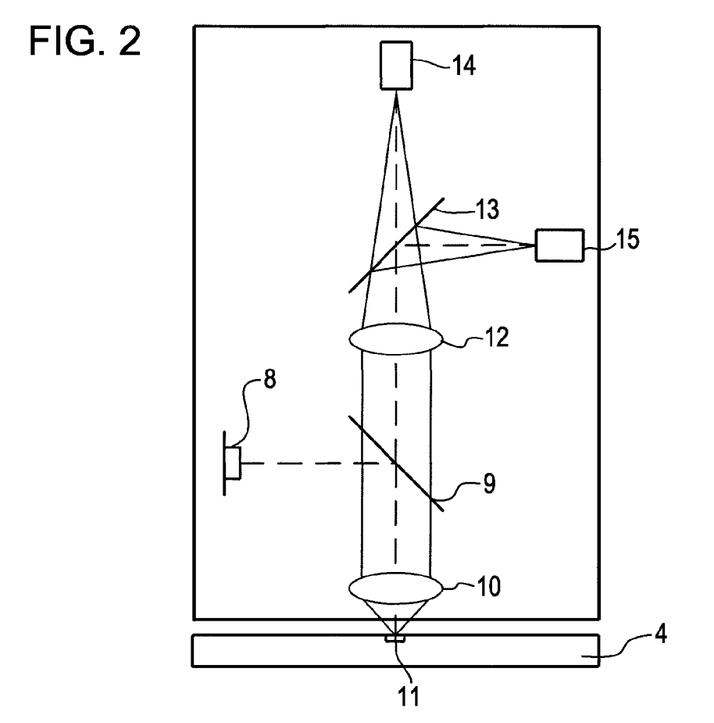
FIG. 2 shows in detail the position detecting optical system in FIG. 1.

FIG. 2 shows the main components of the alignment detecting optical system 7. Illuminating light from a light source 8 is reflected by a beam splitter 9, passes through a lens 10, and illuminates an alignment mark 11 on the wafer 4. Diffracted light from the alignment mark 11 passes through the lens 10, the beam splitter 9, and a lens 12 and is split by a beam splitter 13. The resulting beams are detected by CCD sensors (image pickup elements) 14 and 15, respectively. The image of the alignment mark 11, being enlarged by the lenses 10 and 12 at such a magnification that the resolution can satisfy the measurement accuracy, is formed on the CCD sensors 14 and 15. The CCD sensors 14 and 15 are used for detecting a shift of the alignment mark 11 in the X and Y directions, respectively, and are placed at an angle of 90 degrees with respect to the optical axis. Since the principle of measurement in the Y direction is the same as that in the X direction, only the position measurement in the X direction will be described.

Figure 3:
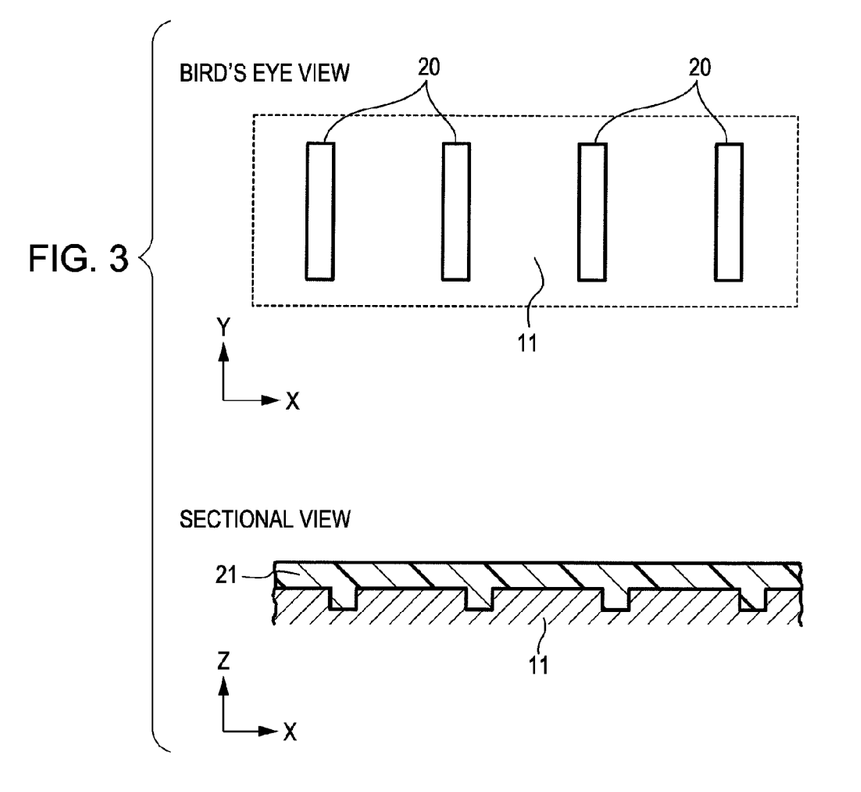
FIG. 3 shows an example of the mark structure for position measurement in FIG. 2.

FIG. 3 shows an example of alignment mark 11 used for position measurement. In the example shown in FIG. 3, a plurality of rectangular alignment marks 20 are arranged at a predetermined interval in the X direction. The alignment marks 20 have predetermined lengths in the measurement direction (X direction) and the non-measurement direction (Y direction). The cross section structure of the alignment mark 11 includes depressions made by etching. The alignment mark 11 is coated with photoresist 21.

Figure 4:
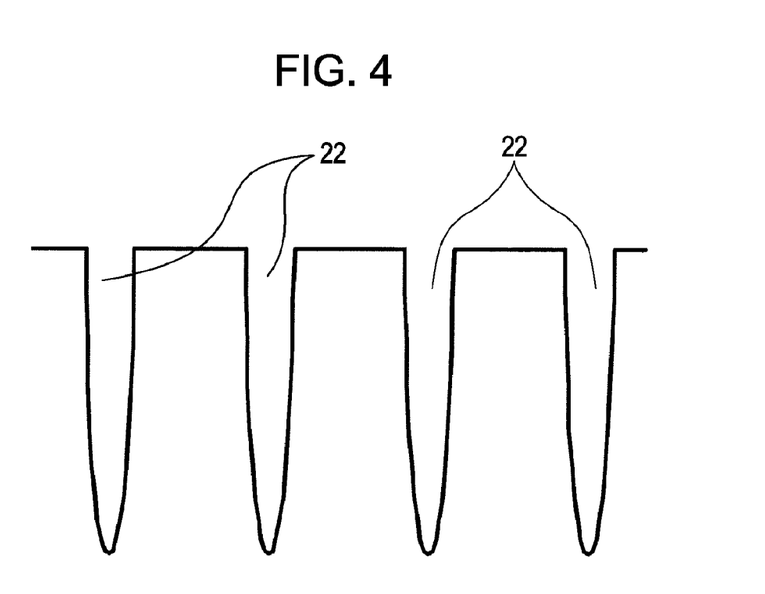
FIG. 4 shows exemplary mark signals obtained from the mark of FIG. 3.

FIG. 4 shows exemplary mark signals when the plurality of alignment marks 20 are irradiated with illuminating light and reflected light obtained is detected by the CCD sensor 14. Each mark position is detected on the basis of each mark signal 22 in FIG. 4. Finally, the mean of each mark position is obtained as the alignment mark position x.

Figure 10:
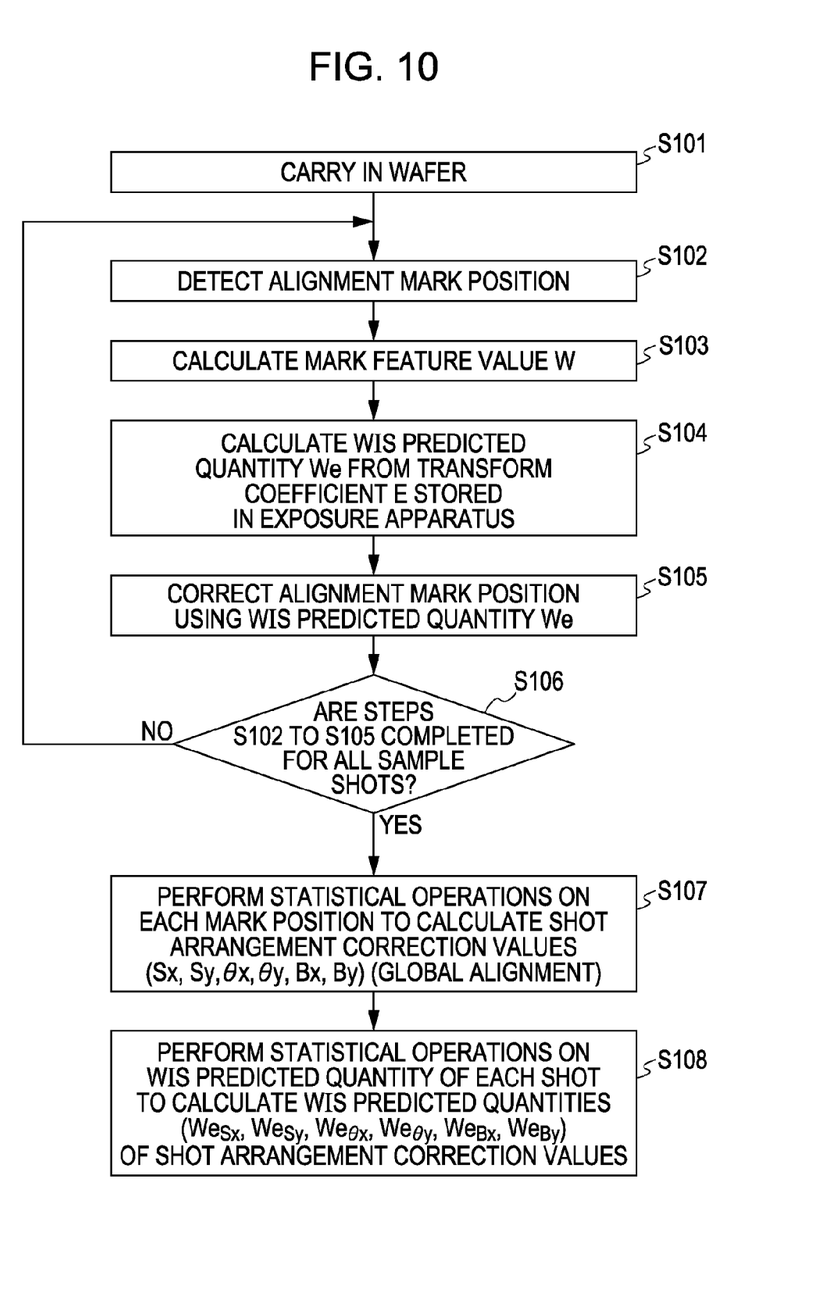
FIG. 10 is a flowchart of an alignment process according to a first embodiment of the present invention.
Figure 11:
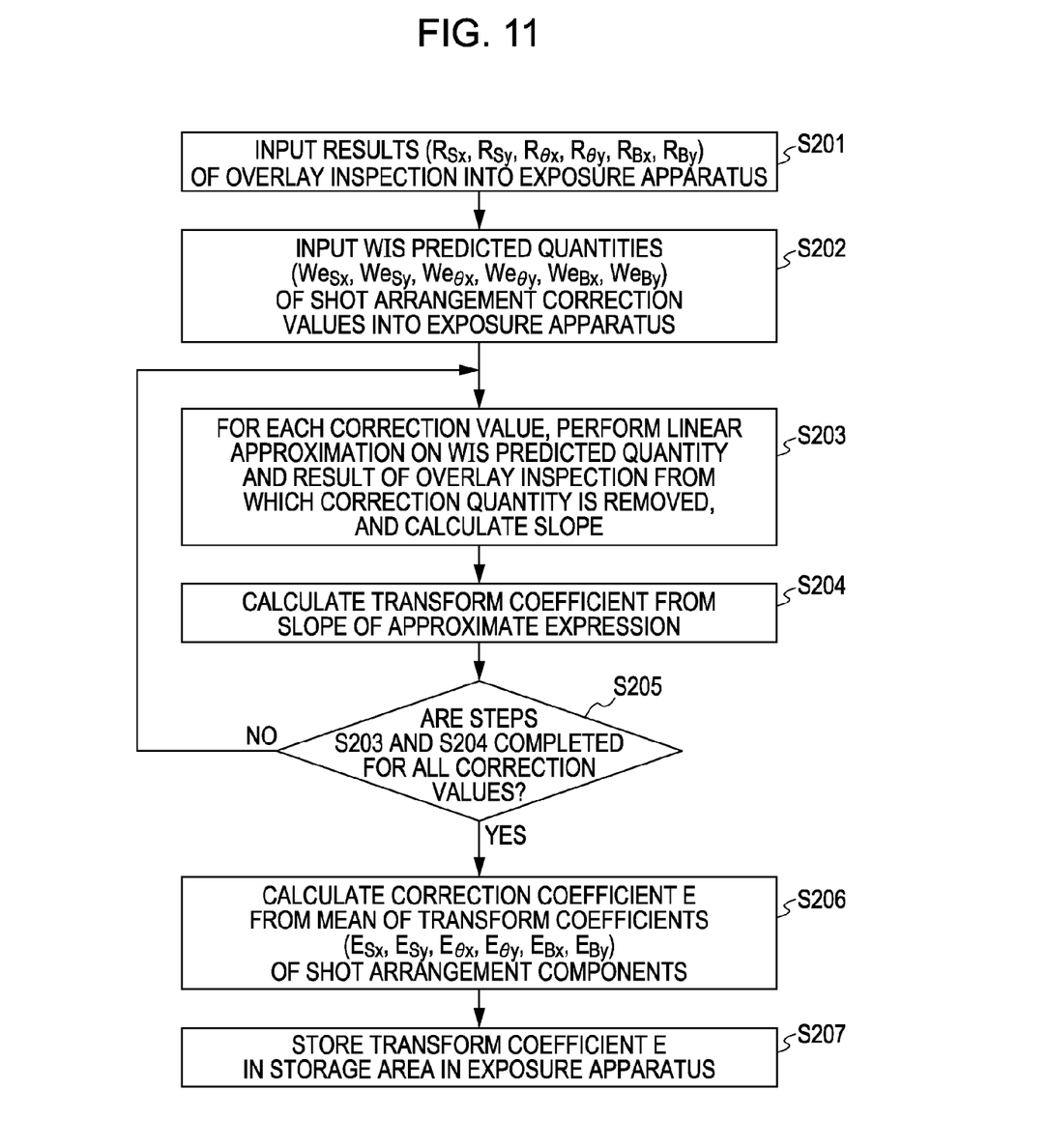
FIG. 11 is a flowchart of a transform coefficient updating process according to a first embodiment of the present invention.

FIGS. 10 and 11 are flowcharts of an alignment process and a transform coefficient updating process showing an alignment method that the exposure apparatus of FIG. 1 performs. A description will be given with reference to these. First, in the alignment process of FIG. 10, a wafer 4 is carried in the exposure apparatus 1 in step S101. Next, in step S102, the position x of an alignment mark 11 on the wafer 4 is detected as described above with reference to FIGS. 2 to 4.

Next, in step S103, "a value that quantitatively represents the feature of a mark signal (hereinafter referred to as mark feature value W) is calculated. The mark feature value W is calculated using Expression 1 that is expressed using the asymmetry quantity S of a mark signal, the contrast C of a mark signal, and the shape P of a mark signal. In addition to the above S, C, and P or instead of one of them, the S/N of a mark signal may be used.

[Expression 1]

$$W = A * S^a * C^b * P^c \quad (1)$$

In Expression 1, A, a, b, and c are constants obtained from the relationship between mark feature value and WIS.

Figure 5:
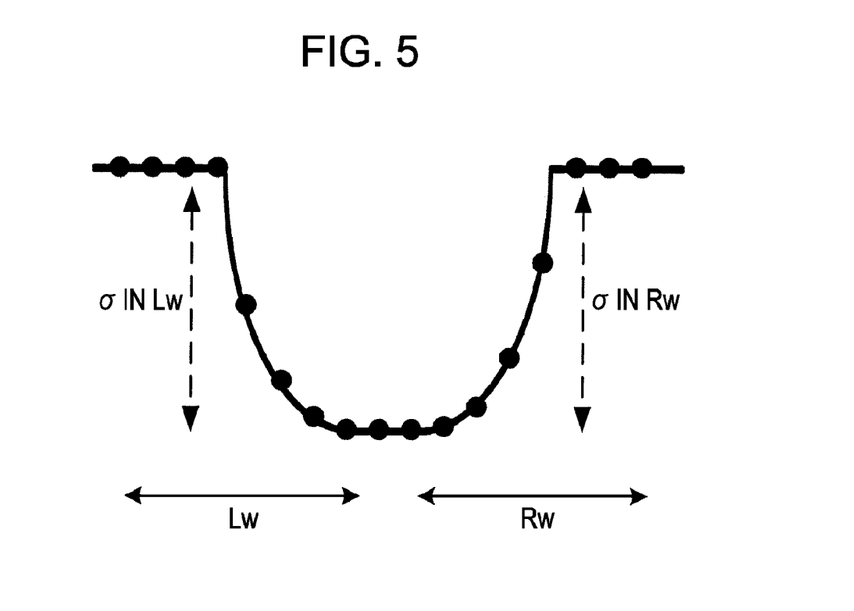
FIG. 5 illustrates a mark feature value according to a first embodiment of the present invention.

The asymmetry quantity S of a mark signal is defined by Expression 2 with respect to "the right side processing region Rw (hereinafter referred to as right window)" and "the left side processing region Lw (hereinafter referred to as left window)" of a mark signal of FIG. 5.

[Expression 2]

$$S = \frac{\sigma \text{ in } Rw - \sigma \text{ in } Lw}{\sigma \text{ in } Rw + \sigma \text{ in } Lw} \quad (2)$$

$\sigma$: Standard deviation

Figure 6:
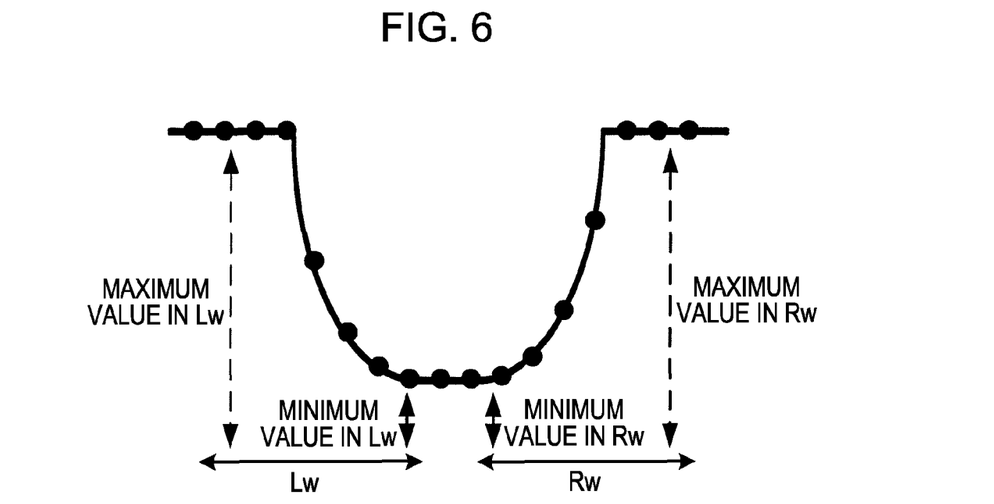
FIG. 6 illustrates another mark feature value according to a first embodiment of the present invention.

The contrast C of a mark signal is defined by Expression 3 with respect to the right window Rw and the left window Lw of a mark signal of FIG. 6.

[Expression 3]

$$C = \frac{\text{Contrast in } Rw + \text{Contrast in } Lw}{2} \quad (3)$$

$$\text{Contrast in } w = \frac{\text{Maximum value in } w - \text{Minimum value in } w}{\text{Maximum value in } w + \text{Minimum value in } w}$$

Figure 7:
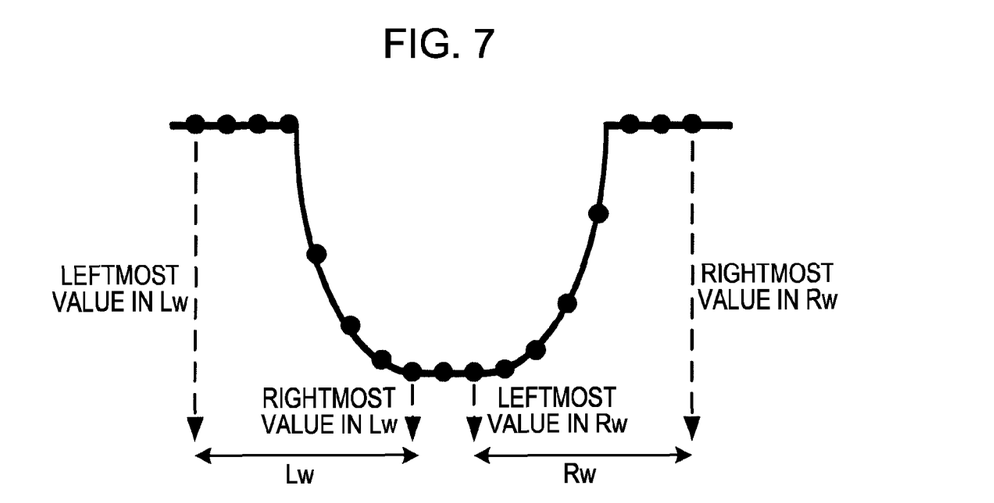
FIG. 7 illustrates yet another mark feature value according to a first embodiment of the present invention.

The shape P of a mark signal is defined by Expression 4 with respect to the right window Rw and the left window Lw of a mark signal of FIG. 7.

[Expression 4]

$$P = \frac{\left(\begin{array}{l}\text{Rightmost value in } Lw + \\ \text{Leftmost value in } Rw\end{array}\right) - \left(\begin{array}{l}\text{Leftmost value in } Lw + \\ \text{Rightmost value in } Rw\end{array}\right)}{\left(\begin{array}{l}\text{Rightmost value in } Lw + \\ \text{Leftmost value in } Rw\end{array}\right) + \left(\begin{array}{l}\text{Leftmost value in } Lw + \\ \text{Rightmost value in } Rw\end{array}\right)} \quad (4)$$

Figure 8:
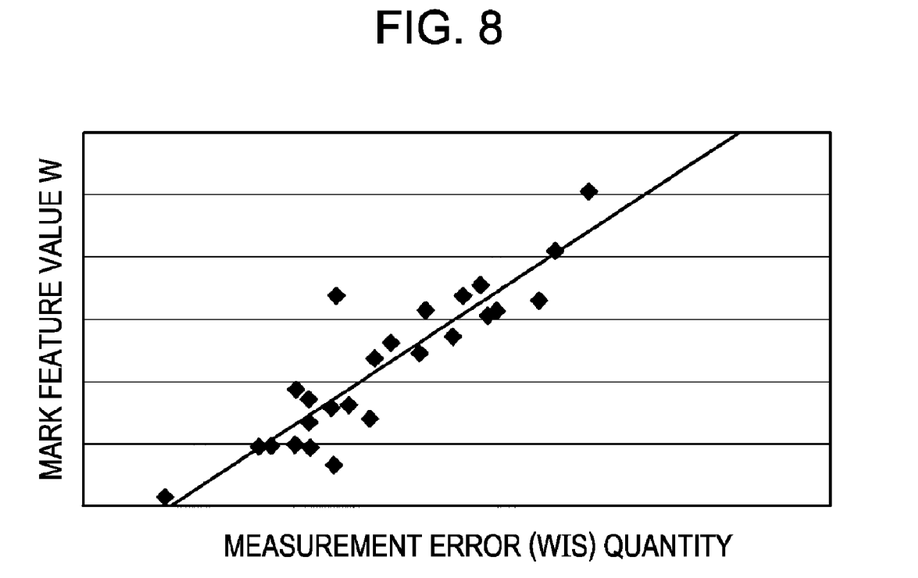
FIG. 8 provides a chart which shows the correlation between mark feature value and measurement error quantity according to a first embodiment of the present invention.

It is confirmed that there is a correlation between mark feature value W and WIS, in experiments using a wafer in which a WIS actually occurred. The correlation is, for example, as shown in FIG. 8. That is, by obtaining a mark feature value W, "a predicted quantity of WIS that a mark signal produces (hereinafter referred to as WIS predicted quantity We)" can be known. The WIS predicted quantity We is calculated in step S104 using a transform coefficient E determined by the slope of the approximate line of FIG. 8 (Expression 5).

[Expression 5]

$$\begin{bmatrix} We_x \\ We_y \end{bmatrix} = E \times \begin{bmatrix} W_x \\ W_y \end{bmatrix} \quad (5)$$

$We_x, We_y$: WIS predicted quantities in $x$ and $y$ directions,
$E$: Transform coefficient
$W_x, W_y$: Mark feature values in $x$ and $y$ directions It is known that the slope of the approximate line of mark feature value W and WIS predicted quantity We changes depending on the device manufacturing process. The transform coefficient E of Expression 5 is not a constant value. Therefore, it is difficult to use a transform coefficient E calculated from the relationship between a mark feature value W and a WIS predicted quantity We under certain conditions, in all device manufacturing processes. In this embodiment, the transform coefficient E is updated by feeding back "an actual alignment error quantity (hereinafter referred to as overlay inspection result)" inspected by an overlay inspection unit after the exposure of a wafer in a device manufacturing process. The details of the process for feeding back the overlay inspection result to the exposure apparatus will be described below.

Next, in step S105, using the calculated WIS predicted quantity We, according to Expression 6, a WIS-corrected mark position (x', y') is calculated from the detected alignment mark position (x, y).

[Expression 6]

$$\begin{bmatrix} x' \\ y' \end{bmatrix} = \begin{bmatrix} x \\ y \end{bmatrix} - \begin{bmatrix} We_x \\ We_y \end{bmatrix} \quad (6)$$

$x', y'$: Mark detection position after correction,
$x, y$: Mark detection position before correction Next, for "several shots selected from all shots on the wafer (hereinafter referred to as sample shots)," steps S102 to S105 are repeated to sequentially, in step S106, to calculate the alignment mark position and the mark feature value W of each sample shot. In addition, the WIS-corrected mark value (x', y') is calculated.

Next, in step S107, statistical operations are performed on the alignment mark position of each sample shot to calculate the correction value of all of the shot arrangement (global alignment). The details of global alignment is described in Japanese Patent Laid-Open No. 63-232321. Only the calculation method of global alignment will be briefly described.

The quantity of displacement of a wafer can be described by the following parameters: shift Sx in the x direction, shift Sy in the y direction, rotation θx with respect to the x axis, rotation θy with respect to the y axis, magnification Bx in the x direction, and magnification By in the y direction. The measurement value Ai of each sample shot is determined by Expression 7, where i is the measurement shot number, and (xi, yi) is the measurement value after the WIS is corrected according to Expression 6.

[Expression 7]

$$Ai = \begin{bmatrix} xi \\ yi \end{bmatrix} \quad (7)$$

The designed position coordinates Di of the alignment mark of each sample shot are determined by Expression 8.

[Expression 8]

$$Di = \begin{bmatrix} Xi \\ Yi \end{bmatrix} \quad (8)$$

In global alignment, the following linear coordinate transformation D'i is performed using the above-described six parameters (Sx, Sy, θx, θy, Bx, By) that represent the displacement of a wafer. D'i is determined by Expression 9.

[Expression 9]

$$D'i = \begin{bmatrix} Bx & -\theta y \\ \theta x & By \end{bmatrix} Di + \begin{bmatrix} Sx \\ Sy \end{bmatrix} \quad (9)$$

In the expression, since θx and θy are very small, approximations such as cos θ=1 and sin θ=0 are used. In addition, since Bx≈1 and By≈1, approximations such as θx*Bx=θx and θy*By=θy are used.

Figure 9:
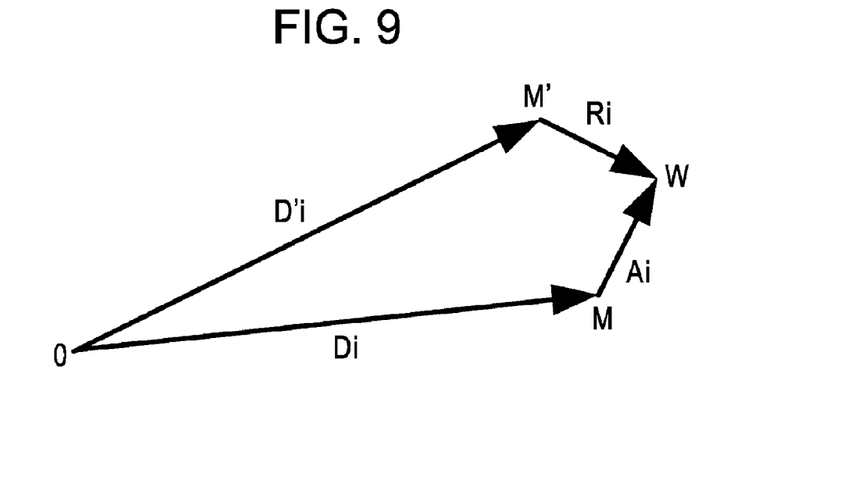
FIG. 9 illustrates global alignment according to a first embodiment of the present invention.

As shown in FIG. 9, an alignment mark on a wafer is located at the position indicated by W and is displaced by Ai from the designed position M. If the coordinate transformation D'i is performed, the displacement of the alignment mark on the wafer is "Ri (hereinafter referred to as correction residual Ri)." FIG. 9 is a schematic view showing the coordinate transformation D'i and the correction residual Ri. The correction residual Ri is determined by Expression 10. Ri is a displacement between W and M'. M' is a position of the alignment mark obtained by the coordinate transformation that is expressed by Expression 9.

[Expression 10]

$$Ri=(Di+Ai)-D'i \quad (10)$$

In global alignment, the least squares method is used to minimize the correction residual Ri of each sample shot. That is, parameters (Sx, Sy, θx, θy, Bx, By) that minimize the mean of sum of squares V of the correction residual Ri, are calculated. V is determined by Expressions 11 and 12.

[Expression 11]

$$V = \frac{1}{n}\sum |Ri|^2 \quad (11)$$

$$= \frac{1}{n}\sum_{i=1}^{i=n} \left| \begin{bmatrix} xi \\ yi \end{bmatrix} - \begin{bmatrix} Bx-1 & -\theta y \\ \theta x & By-1 \end{bmatrix}\begin{bmatrix} Xi \\ Yi \end{bmatrix} - \begin{bmatrix} Sx \\ Sy \end{bmatrix} \right|^2$$

[Expression 12]

$$\begin{bmatrix} \delta V/\delta Sx \\ \delta V/\delta Sy \\ \delta V/\delta \theta x \\ \delta V/\delta \theta y \\ \delta V/\delta Bx \\ \delta V/\delta By \end{bmatrix} = 0 \quad (12)$$

The parameters (Sx, Sy, θx, θy, Bx, By) are obtained by substituting the measurement value $(x_i, y_i)$ and the designed position coordinates (Xi, Yi) of each sample shot into Expressions 11 and 12. In this way, calculation of the correction value of all of the shot arrangement by global alignment is completed.

Next, global alignment operation is performed on the WIS predicted quantity We of each mark to calculate "the WIS predicted quantity ($W_{eSx}$, $W_{eSy}$, $W_{e\theta x}$, $W_{e\theta y}$, $W_{eBx}$, $W_{eBy}$) of the shot arrangement correction value" in step S108. The WIS predicted quantity ($W_{eSx}$, $W_{eSy}$, $W_{e\theta x}$, $W_{e\theta y}$, $W_{eBx}$, $W_{eBy}$) of the shot arrangement correction value is calculated by replacing the measurement value of each shot (Expression 7) in the global alignment of step S107 by the WIS predicted quantity of each shot (Expression 13) and performing the same calculations as Expressions 8 to 12.

[Expression 13]

$$W_{ei} = \begin{bmatrix} W_{exi} \\ W_{eyi} \end{bmatrix} \quad (13)$$

The WIS predicted quantity ($W_{eSx}$, $W_{eSy}$, $W_{e\theta x}$, $W_{e\theta y}$, $W_{eBx}$, $W_{eBy}$) of the shot arrangement correction value is composed of the same components as the shot arrangement correction value (Sx, Sy, θx, θy, Bx, By). This WIS predicted quantity is stored in a storage area (not shown) outside the exposure apparatus when a wafer is aligned.

Next, the process for updating the transform coefficient E by feeding back the overlay inspection result to the exposure apparatus will be described with reference to the flowchart of FIG. 11. First, in step S201, the overlay inspection result is input into the exposure apparatus. The result of an inspection usually performed in a device manufacturing process can be used as the overlay inspection result without any modification. The overlay inspection result is input into the exposure apparatus in the form of "the quantity ($R_{Sx}$, $R_{Sy}$, $R_{\theta x}$, $R_{\theta y}$, $R_{Bx}$, $R_{By}$) of displacement of shot arrangement." Next, in step S202, the WIS predicted quantity ($W_{eSx}$, $W_{eSy}$, $W_{e\theta x}$, $W_{e\theta y}$, $W_{eBx}$, $W_{eBy}$) of the shot arrangement correction value when an overlay-inspected wafer is aligned in the exposure apparatus, is input into the exposure apparatus.

Next, in step S203, the WIS predicted quantity $W_{eSx}$ corrected at the time of exposure is added to the overlay inspection result $R_{Sx}$, that is, ($R_{Sx}+W_{eSx}$) is calculated, and a linear approximation is performed on ($R_{Sx}+W_{eSx}$) and $W_{eSx}$, and the slope of the approximate expression is calculated. In this way, the exposure apparatus learns the transform coefficient $E_{Sx}$ so that the overlay inspection result becomes zero. Next, in step S204, the transform coefficient $E_{Sx}$ of Expression 5 is obtained from the slope of the approximate expression. Steps S203 and S204 are repeatedly performed for each shot arrangement component to calculate the transform coefficients ($E_{Sx}$, $E_{Sy}$, $E_{\theta x}$, $E_{\theta y}$, $E_{Bx}$, $E_{By}$) of all of the shot arrangement components in step S205. Next, in step S206, according to Expression 14, the transform coefficient ($E_{Sx}$, $E_{Sy}$, $E_{\theta x}$, $E_{\theta y}$, $E_{Bx}$, $E_{By}$) of each shot arrangement component is averaged to obtain the final transform coefficient E.

[Expression 14]

$$E=(E_{Sx}+E_{Sy}+E_{\theta x}+E_{\theta y}+E_{Bx}+E_{By})/6 \qquad (14)$$

Next, the transform coefficient E in a storage area (not shown) in the exposure apparatus is updated, and the transform coefficient updating process is completed in S207. According to this embodiment, alignment in which WIS is highly precisely corrected can be achieved without being affected by changes due to the device manufacturing process.

The shape of the alignment mark 11 of this embodiment is not limited to that of FIG. 3. The method for calculating a mark feature value W is not limited to that described above. Any value that correlates with WIS can be used. It is possible to store the WIS predicted quantity ($W_{eSx}$, $W_{eSy}$, $W_{e\theta x}$, $W_{e\theta y}$, $W_{eBx}$, $W_{eBy}$) of the shot arrangement correction value in a storage area provided in the exposure apparatus and to input only the overlay inspection result into the exposure apparatus when the transform coefficient is updated. Not all of the shot arrangement components used for calculating the transform coefficient need be used. Any one or more of the shot arrangement components can be selected to use.

Second Exemplary Embodiment

In a second embodiment, on the basis of the overlay inspection result, the transform coefficient ($E_{Sx}$, $E_{Sy}$, $E_{\theta x}$, $E_{\theta y}$, $E_{Bx}$, $E_{By}$) of each shot arrangement component is separately updated. Using separate transform coefficients, the WIS predicted quantity ($W_{eSx}$, $W_{eSy}$, $W_{e\theta x}$, $W_{e\theta y}$, $W_{eBx}$, $W_{eBy}$) of the shot arrangement correction value is calculated. Using this WIS predicted quantity, the shot arrangement correction value (Sx, Sy, θx, θy, Bx, By) at the time of global alignment is corrected.

Figure 12:
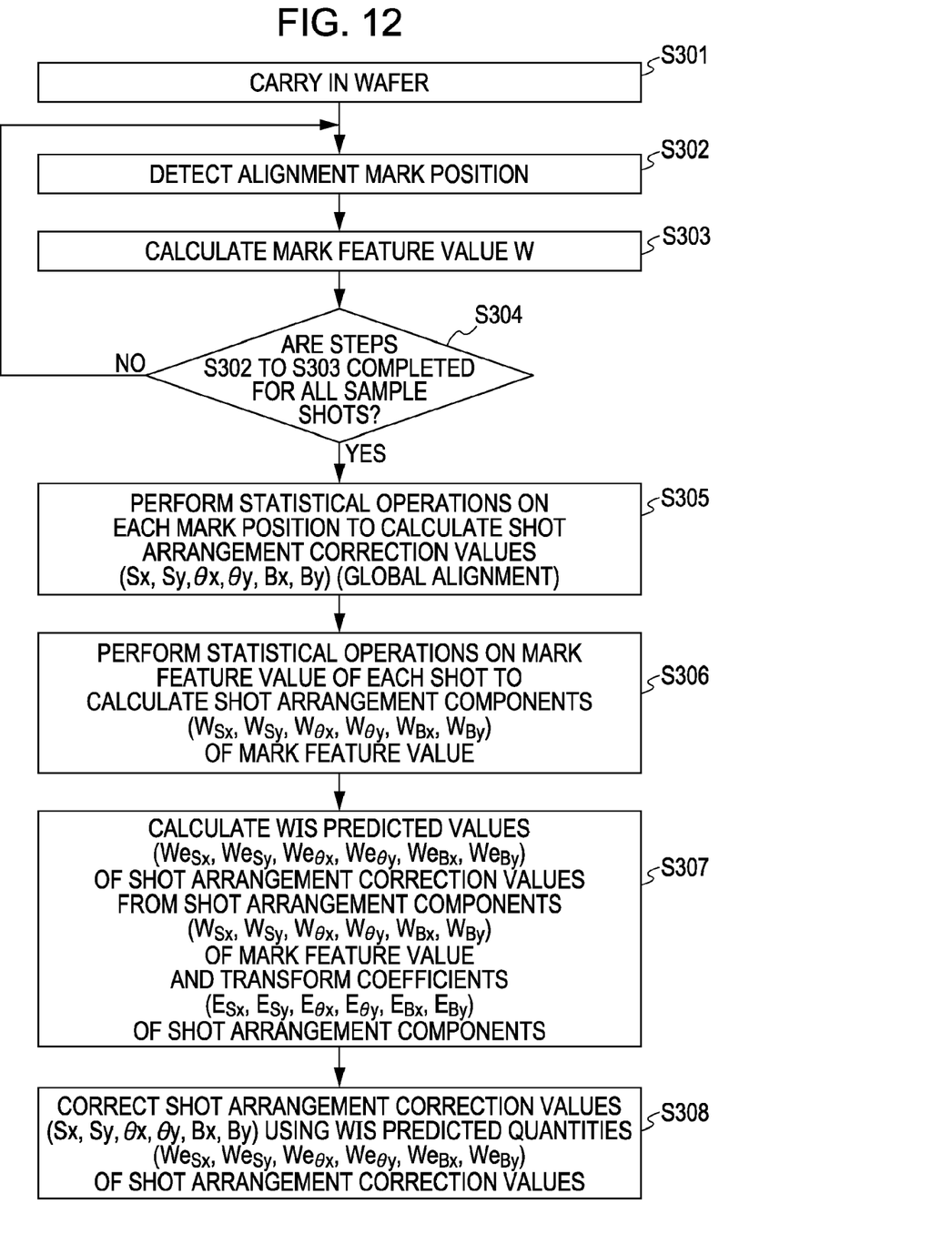
FIG. 12 is a flowchart of an alignment process according to a second embodiment of the present invention.
Figure 13:
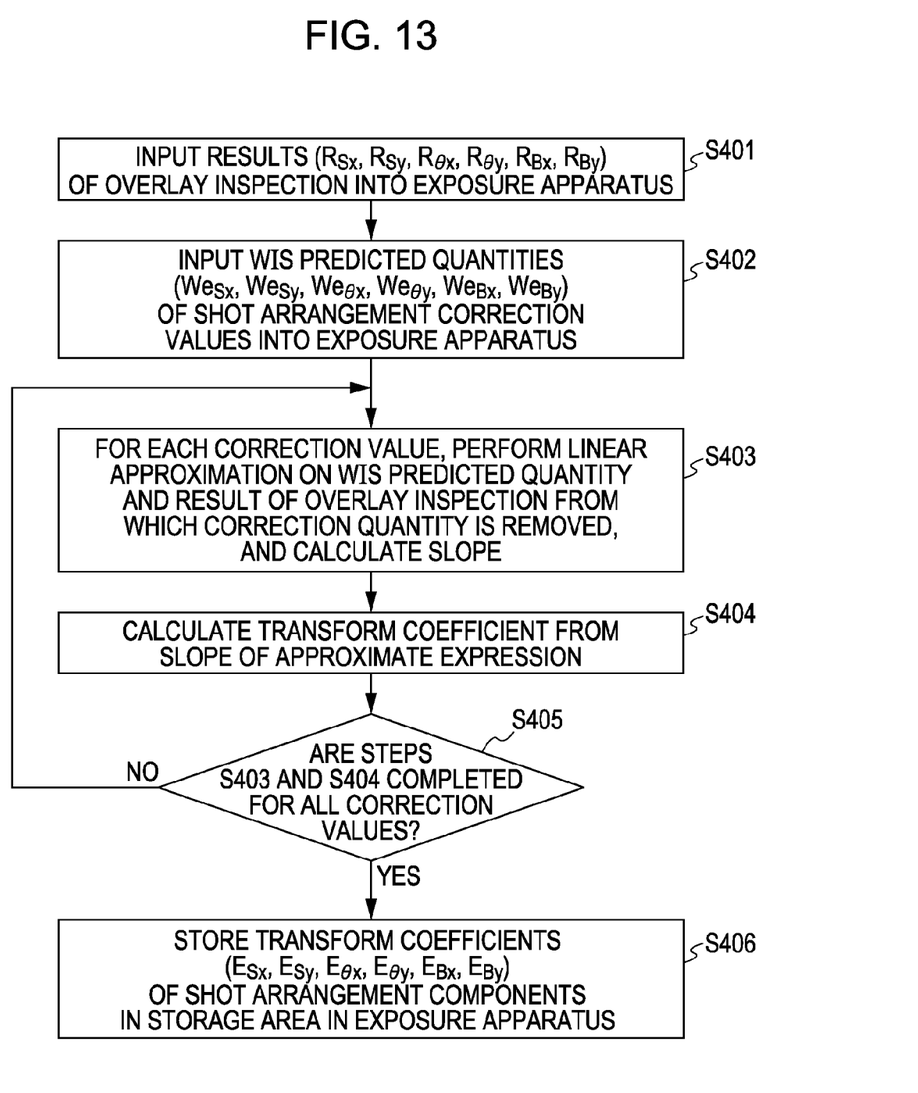
FIG. 13 is a flowchart of a transform coefficient updating process according to a second embodiment of the present invention.

A description will be given with reference to the flowcharts of FIGS. 12 and 13. The structure of the whole apparatus and the operation of the whole apparatus are the same as those of the first embodiment, except for the alignment process of steps S301 to S308 of FIG. 12 and the transform coefficient updating process of steps S401 to S405 of FIG. 13. First, the alignment process of this embodiment will be described with reference to the flowchart of FIG. 12. The steps S301 (carrying in a wafer) to S303 (calculating a mark feature value W) are the same and or similar as the steps S101 to S103 of the first embodiment.

Next, for the sample shots, steps S301 to S303 are repeated to sequentially, in step S304, to calculate the alignment mark position and the mark feature value W of each sample shot. In this embodiment, in step S305, the measurement value of each shot is applied to Expression 7 without any modification, and global alignment is performed to calculate the shot arrangement correction value (Sx, Sy, θx, θy, Bx, By). Next, in step S306, the measurement value of each shot (Expression 7) is replaced by the mark feature value W of each shot (Expression 15), and the same calculations as Expressions 8 to 12 are performed to calculate the shot arrangement components ($W_{Sx}$, $W_{Sy}$, $W_{\theta x}$, $W_{\theta y}$, $W_{Bx}$, $W_{By}$) of the mark feature value.

[Expression 15]

$$W_i = \begin{bmatrix} W_{xi} \\ W_{yi} \end{bmatrix} \qquad (15)$$

Next, in step S307, the transform coefficient ($E_{Sx}$, $E_{Sy}$, $E_{\theta x}$, $E_{\theta y}$, $E_{Bx}$, $E_{By}$) of each shot arrangement component stored in the exposure apparatus and the shot arrangement components ($W_{Sx}$, $W_{Sy}$, $W_{\theta x}$, $W_{\theta y}$, $W_{Bx}$, $W_{By}$) of the mark feature value are substituted into Expression 16. In this way, the WIS predicted quantity ($W_{eSx}$, $W_{eSy}$, $W_{e\theta x}$, $W_{e\theta y}$, $W_{eBx}$, $W_{eBy}$) of the shot arrangement correction value is calculated.

[Expression 16]

$$We_{Sx}=E_{Sx} \times W_{Sx}$$

$$We_{Sy}=E_{Sy} \times W_{Sy}$$

$$We_{\theta x}=E_{\theta x} \times W_{\theta x}$$

$$We_{\theta y}=E_{\theta y} \times W_{\theta y}$$

$$We_{Bx}=E_{Bx} \times W_{Bx}$$

$$We_{By}=E_{By} \times W_{By} \qquad (16)$$

Next, in step S308, the shot arrangement correction value in question on the device manufacturing scene is corrected according to Expression 17, and the alignment process is completed.

[Expression 17]

$$SX=Sx-We_{Sx}$$

$$SY=Sy-We_{Sy}$$

$$\theta X=\theta x-We_{\theta x}$$

$$\theta Y=\theta y-We_{\theta y}$$

$$BX=Bx-We_{Bx}$$

$$BY=By-We_{By} \qquad (17)$$

(SX, SY, θX, θY, BX, BY: Shot arrangement correction value after correction)

Next, the transform coefficient updating process of this embodiment will be described with reference to the flowchart of FIG. 13. The steps S401 (inputting the overlay inspection result into the exposure apparatus) to S405 (calculating the transform coefficient ($E_{Sx}$, $E_{Sy}$, $E_{\theta x}$, $E_{\theta y}$, $E_{Bx}$, $E_{By}$) of each shot arrangement component are the same and or similar as steps S201 to S205 of the first embodiment. In this embodiment, in step S406, the transform coefficient ($E_{Sx}$, $E_{Sy}$, $E_{\theta x}$, $E_{\theta y}$, $E_{Bx}$, $E_{By}$) of each shot arrangement component in a storage area (not shown) in the exposure apparatus is updated, and the transform coefficient updating process is completed. Using this embodiment makes it possible to correct only the WIS of a specific shot arrangement component and to achieve high precision alignment without affecting other components not in question. In addition, when each shot arrangement component has a different transform coefficient, high precision alignment is possible without being affected by other components.

Third Exemplary Embodiment

Figure 14:
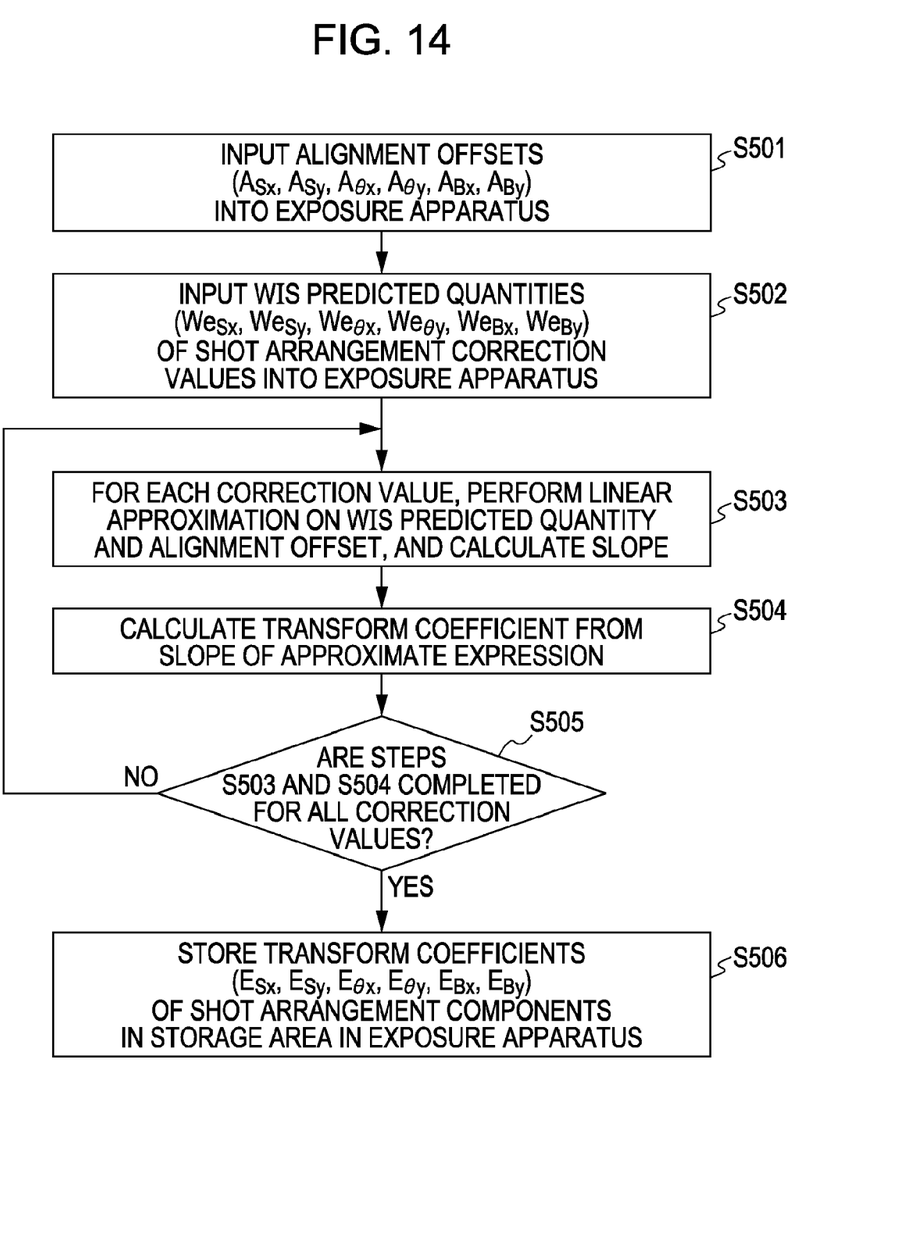
FIG. 14 is a flowchart of a transform coefficient updating process according to a third embodiment of the present invention.

In a third embodiment, the present invention is applied to a device manufacturing process in which the WIS is removed using an alignment offset. FIG. 14 is a flowchart showing the transform coefficient updating process of this embodiment. The structure of the apparatus and the operation of the apparatus is the same and or similar as those of the first embodiment, except for the transform coefficient updating process of steps S501 to S506.

First, an alignment offset will be described. An alignment offset is a value that is input into the exposure apparatus for each wafer process lot, and it removes a known fixed displacement quantity with respect to the correction value (Sx, Sy, θx, θy, Bx, By) of the shot arrangement. In a normal device manufacturing process, the overlay inspection result when a lot in the same manufacturing process is exposed is input into this alignment offset. This is aimed at reducing the misalignment quantity in the same manufacturing process to zero. The final shot arrangement correction value (Sx', Sy', θx', θy', Bx', By') when the alignment offset is input is obtained from Expression 18, where the alignment offset is ($A_{Sx}$, $A_{Sy}$, $A_{\theta x}$, $A_{\theta y}$, $A_{Bx}$, $A_{By}$).

[Expression 18]

$$SX' = Sx - A_{Sx}$$

$$SY' = Sy - A_{Sy}$$

$$\theta X' = \theta x - A_{\theta x}$$

$$\theta Y' = \theta y - A_{\theta y}$$

$$BX' = Bx - A_{Bx}$$

$$BY' = By - A_{By} \quad (18)$$

(SX',SY',θX',θY',BX',BY': Shot arrangement correction value after correction using alignment offset)

A normal device manufacturing process has a system that calculates this alignment offset on the basis of the overlay inspection result of the prior process lot and inputs it into the exposure apparatus. In the alignment process of this embodiment, the alignment offset ($A_{Sx}$, $A_{Sy}$, $A_{\theta x}$, $A_{\theta y}$, $A_{Bx}$, $A_{By}$) is not used for correcting the shot arrangement correction value (Sx, Sy, θx, θy, Bx, By). Instead, the WIS predicted quantity ($W_{eSx}$, $W_{eSy}$, $W_{e\theta x}$, $W_{e\theta y}$, $W_{eBx}$, $W_{eBy}$) shown in Expression 17 is used. Therefore, the alignment process is the same and or similar as steps S301 to S308 of the second embodiment.

In the transform coefficient calculating process of this embodiment, in step S501, the alignment offset is input into the exposure apparatus. Next, in step S502, as in step S202, the WIS predicted quantity ($W_{eSx}$, $W_{eSy}$, $W_{e\theta x}$, $W_{e\theta y}$, $W_{eBx}$, $W_{eBy}$) of the shot arrangement correction value is input. Next, in step S503, a linear approximation is performed on the alignment offset $A_{Sx}$ and $W_{eSx}$, and the slope of the approximate expression is calculated. Next, in step S504, the transform coefficient $E_{Sx}$ of Expression 5 is obtained from the slope of the approximate expression. Steps S503 and S504 are repeatedly performed for each shot arrangement component to calculate the transform coefficients ($E_{Sx}$, $E_{Sy}$, $E_{\theta x}$, $E_{\theta y}$, $E_{Bx}$, $E_{By}$) of all of the shot arrangement components in step S505. The subsequent transform coefficient storing step (step S506) is the same as step S206.

Applying this embodiment makes it possible to use, without any modification, a system for inputting an alignment offset into an exposure apparatus in a device manufacturing process, and to thereby easily apply the present invention. It is easily possible to apply this embodiment to the second embodiment that uses the transform coefficient of each shot arrangement component.

In the present invention, the correction value (Sx, Sy, θx, θy, Bx, By) of the shot arrangement is corrected using the WIS predicted quantity obtained by learning the transform coefficient. Therefore, if the device manufacturing process changes due to a change in condition such as CMP, it is possible to cope with the change without requiring a correction by an offset.

That is, in the present invention, alignment can be performed so as to remove a WIS occurring on the device manufacturing scene, regardless of the process situation on the device manufacturing scene. Consequently, the yield in the semiconductor device manufacturing process can be improved.

Embodiment of Device Manufacturing Method

Next, an embodiment of device manufacturing process using the above-described exposure apparatus will be described. Devices such as semiconductor devices, liquid crystal display devices, image pickup devices (for example, CCDs), and thin film magnetic heads are manufactured through the steps of exposing a substrate (for example, a wafer or a glass plate) coated with photoresist using the above-described exposure apparatus, and developing the exposed substrate, and other known steps. The known steps can include at least one step of, for example, oxidizing, film formation, deposition, doping, planarization, etching, resist stripping, dicing, bonding, and packaging.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-262947 filed Oct. 9, 2007, which is hereby incorporated by reference herein in its entirety.

What is claimed is:

1. An exposure apparatus that exposes each shot to radiant energy according to shot arrangement on a substrate, the apparatus comprising:
   a detector configured to detect a mark; and
   a processor configured to determine a coefficient of an expression that represents the shot arrangement by coordinate transformation of reference shot arrangement based on positions of marks of a plurality of shots on the substrate detected by the detector, the processor being configured to obtain an offset value for the coefficient from a feature value that relates to asymmetry of a signal of a mark detected by the detector and a predetermined relationship between the feature value and the offset value , and to offset the coefficient with the obtained offset value,
   wherein the processor is further configured to learn the relationship based on a coefficient that represents an error of the offset coefficient obtained through an overlay inspection apparatus, the offset value, and the feature value.

2. An apparatus according to claim 1, wherein the feature value further relates to at least one of contrast, signal-to-noise ratio, and shape of the signal.

3. An apparatus according to claim 1, wherein the coefficient of the expression relates to at least one of shift, rotation, and magnification.

4. An apparatus according to claim 1, wherein the processor is further configured to perform an approximation by a linear function to learn the relationship.

5. A method of manufacturing a device utilizing an exposure apparatus that exposes each shot to radiant energy according to shot arrangement on a substrate, the apparatus including,
   a detector configured to detect a mark; and
   a processor configured to determine a coefficient of an expression that represents the shot arrangement by coordinate transformation of reference shot arrangement based on positions of marks of a plurality of shots on the substrate detected by the detector, the processor being configured to obtain an offset value for the coefficient, from a feature value that relates to asymmetry of a signal of a mark detected by the detector and a predetermined relationship between the feature value and the offset value, and to offset the coefficient with the obtained offset value,
   wherein the processor is further configured to learn the relationship based on a coefficient that represents an error of the offset coefficient obtained through an overlay inspection apparatus, the offset value, and the feature value;
   the method comprising:
   exposing a substrate to radiant energy using the exposure apparatus;
   developing the exposed substrate; and
   processing the developed substrate to manufacture the device.

6. A method applied to an exposure apparatus that includes a detector that detects a mark, obtains shot arrangement on a substrate based on positions of marks of a plurality of shots on the substrate detected by the detector, and exposes each shot to radiant energy according to the obtained shot arrangement, the method comprising:
   obtaining a coefficient of an expression that represents the shot arrangement by coordinate transformation of reference shot arrangement based on the positions of the marks of the plurality of shots;
   obtaining an offset value for the coefficient from a feature value that relates to asymmetry of a signal of a mark detected by the detector and a predetermined relationship between the feature value and the offset value;
   offsetting the coefficient with the obtained offset value to obtain the shot arrangement on the substrate; and
   learning the relationship based on a coefficient that represents an error of the offset coefficient obtained through an overlay inspection apparatus, the offset value, and the feature value.

7. A method according to claim 6, wherein the feature value further relates to at least one of contrast, signal-to-noise ratio, and shape of the signal.

8. A method according to claim 6, wherein the coefficient of the expression relates to at least one of shift, rotation, and magnification.

9. A method according to claim 6, wherein the relationship is leaned by performing an approximation by a linear function.

* * * * *